(12) United States Patent
Chen

(10) Patent No.: US 10,910,336 B2
(45) Date of Patent: Feb. 2, 2021

(54) CHIP PACKAGE STRUCTURE

(71) Applicant: Shih-Chi Chen, Taipei (TW)

(72) Inventor: Shih-Chi Chen, Taipei (TW)

( * ) Notice: Subject to any disclaimer, the term of this patent is extended or adjusted under 35 U.S.C. 154(b) by 0 days.

(21) Appl. No.: 16/260,150

(22) Filed: Jan. 29, 2019

(65) Prior Publication Data

US 2020/0243475 A1 Jul. 30, 2020

(51) Int. Cl.
*H01L 25/065* (2006.01)
*H01L 23/00* (2006.01)
*H05K 1/02* (2006.01)

(52) U.S. Cl.
CPC .............. *H01L 24/33* (2013.01); *H01L 24/09* (2013.01); *H01L 24/17* (2013.01); *H01L 24/73* (2013.01); *H01L 24/97* (2013.01); *H01L 25/0657* (2013.01); *H05K 1/0296* (2013.01); *H01L 2224/73204* (2013.01)

(58) Field of Classification Search
CPC ......... H01L 24/33; H01L 24/09; H01L 24/17; H01L 24/73; H01L 24/97; H01L 25/0657; H01L 2224/73204; H05K 1/0296
USPC ........................................................ 257/690
See application file for complete search history.

(56) References Cited

U.S. PATENT DOCUMENTS

| | | | | |
|---|---|---|---|---|
| 7,939,935 | B2* | 5/2011 | Chinda | H01L 21/4853 257/700 |
| 10,256,114 | B2* | 4/2019 | Huemoeller | H01L 24/16 |
| 2009/0309239 | A1* | 12/2009 | Nishimura | H01L 25/0657 257/778 |
| 2013/0095611 | A1* | 4/2013 | Huang | H01L 23/49827 438/110 |
| 2014/0290059 | A1* | 10/2014 | Kawashima | H01R 43/16 29/876 |
| 2018/0277394 | A1* | 9/2018 | Huemoeller | H01L 21/563 |
| 2018/0374813 | A1* | 12/2018 | Khazaka | H01L 21/4846 |

* cited by examiner

*Primary Examiner* — Tu-Tu V Ho

(57) ABSTRACT

A chip package structure, comprises a first chip having a plurality of first chip joints at a lower side thereof; a circuit board below the first chip; an upper side of the circuit board being arranged with a plurality of circuit board joints; in packaging, the first chip joints being combined with the circuit board joints of the circuit board so that the first chip is combined to the circuit board by a way of ACF combination or convex joint combination; and wherein in the ACF combination, ACFs are used as welding points to be combined to the pads at another end so that the chip is combined to the circuit board; and wherein in the convex pad combination, a convex pad is combined with a flat pad by chemically methods or physical methods; and these pads are arranged on the circuit board and the first chip.

3 Claims, 9 Drawing Sheets

CHIP PACKAGE STRUCTURE

FIELD OF THE INVENTION

The present invention is related to chip packaging, and in particular to a chip package structure.

BACKGROUND OF THE INVENTION

In the prior art semiconductor multiple layer chip structure, the welding pads are formed on the circuit board and chips, conduction wires are used to connect the pads so as to achieve the object of signal conduction. Finally, a packaging layer is formed thereon. In the prior art, under consideration of the positions of the joints on different chips or circuit boards, conductive wires are wound and arranged on the whole circuit board. However, these works will induce that the manufacturing process becomes complicated and time consumed is prolonged. Furthermore in packaging a layer of epoxy encloses the whole structure so that the overall size becomes large, the cost is increased and heat dissipation effect becomes worse.

To improve the prior art defects the inventor of the present invention provides a novel structure which is shown in U.S. Pat. No. 9,299,626B2, in that the circuit board at an upper side is formed with opening. Conductive wires serve to connect the chip at a lower side and the circuit board through the opening. The wiring process is used to form the packaging structure in the chip. Above mentioned method is suitable for large scale chips so as to simplify the whole structure and the cost in packaging is lowered. However, development of semiconductor industry, the structure of the chips becomes more and more complicated and the number of layers of the chips increases which cause the prior art packaging technology is necessary to be further improved.

SUMMARY OF THE INVENTION

Accordingly, the object of the present invention is to provide a chip package structure, wherein the joints and conductive wires are hidden within the circuit board and chips and are not exposed out so that the whole packaging structure can be reduced. Therefore, the costs in manufacturing and packaging are also reduced.

To achieve above object, the present invention provides a chip package structure, comprising: a first chip (10) having a plurality of first chip joints (11) at a lower side thereof; a circuit board (20) below the first chip; an upper side of the circuit board (20) being arranged with a plurality of circuit board joints (21) at positions corresponding to those of the first chip joints of the first chip; in packaging, the first chip joints being combined with the circuit board joints of the circuit board so that the first chip is combined to the circuit board by a way of ACF combination or convex joint combination; and wherein in the ACF combination, ACFs are used as welding points to be combined to the pads at another end so that the chip is combined to the circuit board; and wherein in the convex pad combination, a convex pad is combined with a flat pad by chemically methods or physical methods; and these pads are arranged on the circuit board and the first chip.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

With reference to FIGS. 1 to 11, the structure of the present invention is illustrated. The present invention includes the following elements.

A first chip 10 has a plurality of first chip joints 11 at a lower side thereof.

A circuit board 20 is below the first chip 10. An upper side of the circuit board 20 is arranged with a plurality of circuit board joints 21 at positions corresponding to those of the first chip joints 11 of the first chip 10.

Figure 2:
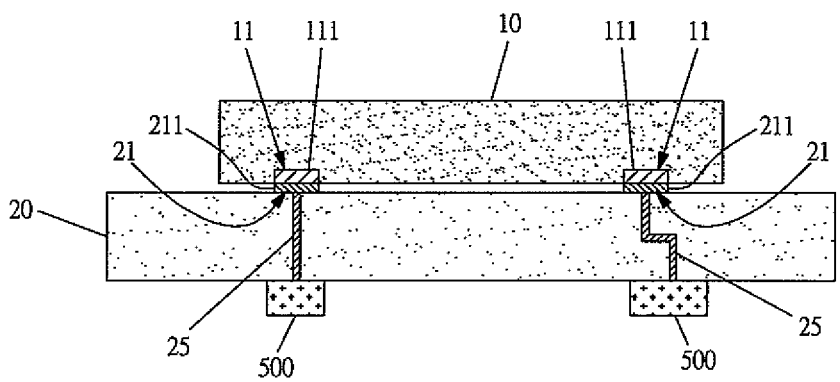
FIG. 2 is another schematic cross sectional view showing the first application in the first embodiment of the present invention.

In packaging, the ,first chip joints 11 are combined with the circuit board joints 21 of the circuit board 20, as illustrated in FIG. 2, so that the first chip 10 is combined to the circuit board 20 by a way of ACF gluing ball combination or convex joint combination.

The first application of this embodiment relates to the ACF (anisotropic conductive film) combination, in that, the ACFs are used as welding points to be combined to the pads at another end so that the chip is combined to the circuit board.

Figure 1:
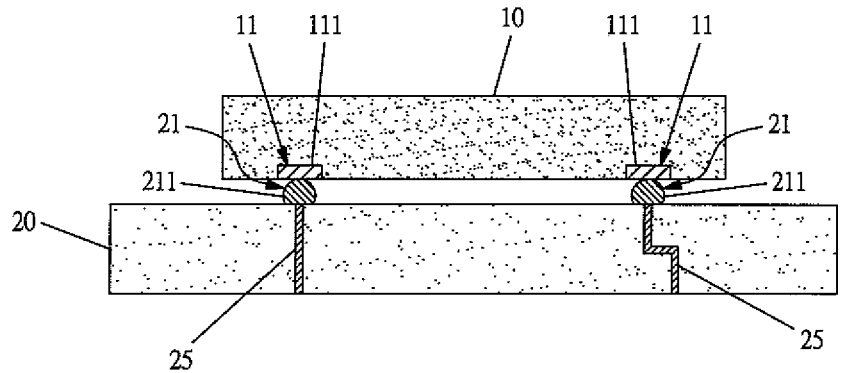
FIG. 1 is a schematic cross sectional view showing the first application in the first embodiment of the present invention.
Figure 3:
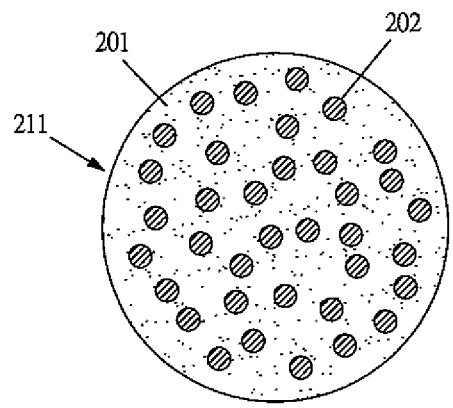
FIG. 3 is a schematic cross sectional view showing the ACF in the first embodiment of the present invention.
Figure 4:
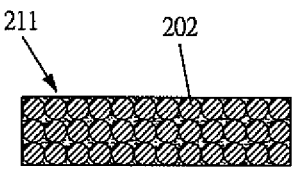
FIG. 4 is a schematic cross sectional view showing the compressed ACF in the first embodiment of the present invention.

With reference to FIG. 1, in ACF combination, the first chip joints 11 are flat pads 111. The circuit board joints 21 is an ACFs 211 as shown in FIG. 3. An ACF 211 is a rubber ball like body 201 with a plurality of metal (such as gold) conductor bodies 202 distributed therein. In packaging, the ACF 211 is compressed and thus deforms, and then the metals are combined together to form as a conductor. Therefore the ACFs becomes conductive; and then it is adhered to the first chip joints 11 of the first chip 10, as illustrated in FIG. 2. Therefore, the first chip 10 is adhered to the circuit board 20. Further referring to FIGS. 3 and 4, in FIG. 3, it is illustrated that the ACF 211 is a soft rubber body 201 with a plurality of metal conductor bodies 202 are distributed therein. After compressing, the metal conductor bodies 202 will contact with one another so that the whole ACF 211 becomes a conductor, and thus the ACF 211 is conductive.

Other circuit elements 500 may be installed to a lower side of the circuit board 20. The elements 500 are connected to the ACF 211 through the conductive wire 25.

The second application of this embodiment is a convex pad combination, in that a convex pad is combined with a flat pad by chemically methods or physical methods. These pads are arranged on the circuit board 20 and the first chip 10.

Figure 5:
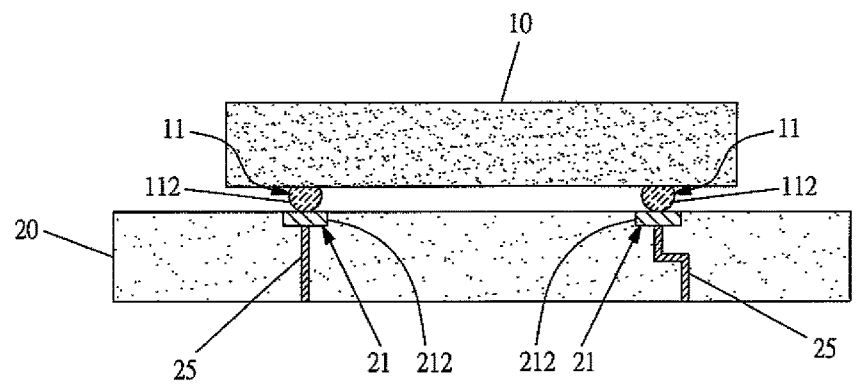
FIG. 5 is a schematic cross section view of the second application of first embodiment of the present invention.
Figure 6:
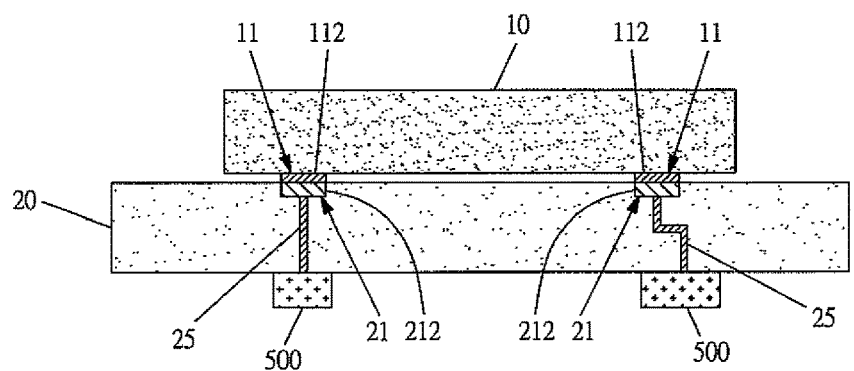
FIG. 6 is another schematic cross section view showing the second application of the first embodiment of the present invention.

In the convex pad combination, the first chip joints 11 are convex pads (such as metal pads or tin balls) protruded from the first chip 10. The circuit board joints 21 are flat pads 212. Material of the flat pad 212 is the same as that of the convex pad 112 is identical to that of the convex pad 112. In packaging, the convex pads 112 of the first chip 10 are combined with the flat pads 212 of the circuit board 20, as illustrated in FIG. 5. Therefore, the first chip 10 is combined to the circuit board 20, see FIG. 6. When material of the convex pad 112 is metal, the combination can be performed by supersonic combination; and when material of the convex pad 112 is tin ball, welding is used in combination.

Figure 21:
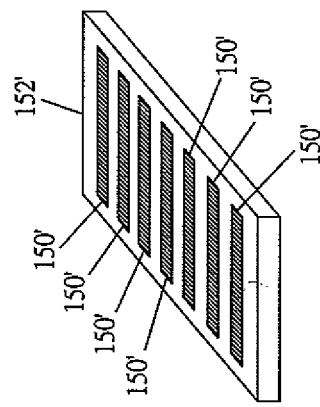
FIG. 21 is a schematic view showing another way for the second application of the first embodiment of the present invention.
Figure 20:
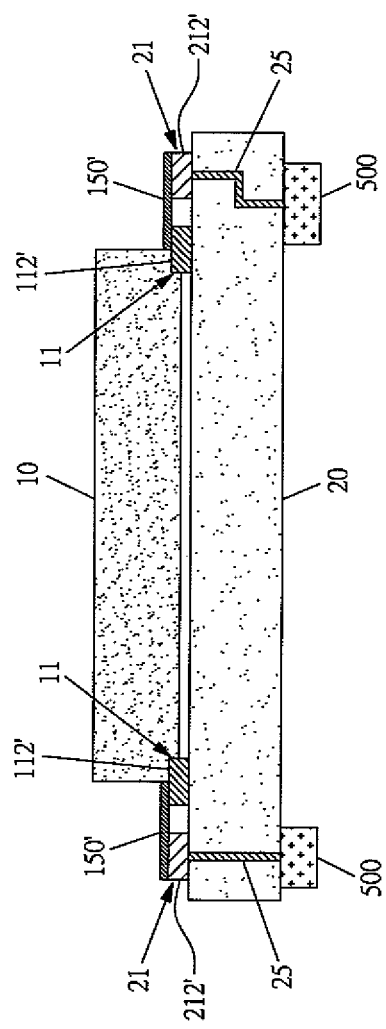
FIG. 20 is a schematic cross section view showing another way in the second application of the first embodiment of the present invention.

FIG. 20 shows another embodiment of the present invention, in that, the first chip joints 11 are convex pads 112' (such as metal joints or tin balls) protruding from a lower side of the first chip 10. The circuit board joints 21 are convex pads 212'. In packaging, the convex pads 112' are combined to the circuit board joints 21 through conductive wires 150'. When there are a plurality of first chip joints 11 and circuit board joints 21, the conductive wire 150' are installed on a conductor substrate 152' (referring to FIG. 21), and then the conductor substrate 152' runs across the first chip joints 11 and the circuit board joints 21 so that the packaging operation can be completed at one time.

Figure 23:
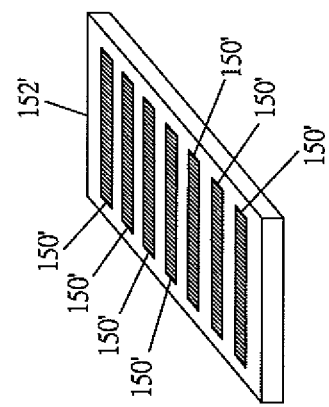
FIG. 23 is a schematic view showing that conductive wires are installed to the substrate of FIG. 22.
Figure 22:
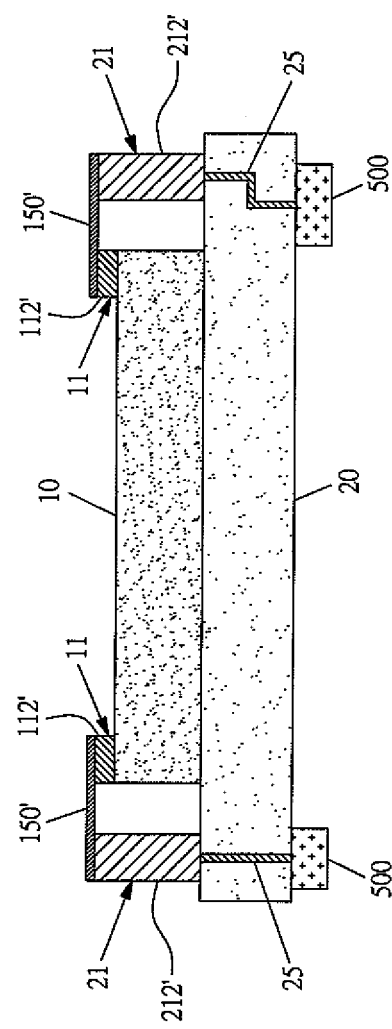
FIG. 22 is a schematic cross section view showing a further way of the second application in the first embodiment of the present invention.

With reference to FIG. 22, the ways for connecting of conductive wire is illustrated, while in FIG. 22, the first chip joints 11 of the first chip 10 are at an upper side of the first chip 10, but the way for packaging is identical to those shown in FIG. 20. The first chip joints 11 are convex pads 212' protruded from a bottom surface of the first chip 10, while the bottom surface is turned upside down so that the convex pads 212' are at an upper side. The circuit board joints 21 are convex pads 212'. In packaging, the convex pads 212' of the first chip 10 are combined to the circuit board joints 21 through conductive wire 150'. When there are a plurality of first chip joints 11 and circuit board joints 21, the conductive wires 150' are arranged on a conductor wire arranged substrate 152' (referring to FIG. 23), and then the conductor wire arranged substrate 152' runs across the circuit board joints 21 and the first chip joints 11.

Figure 7:
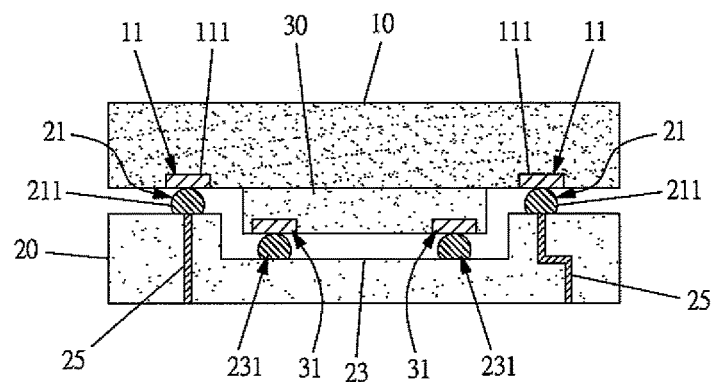
FIG. 7 shows a schematic cross section view of the third application in the first embodiment of the present invention.
Figure 8:
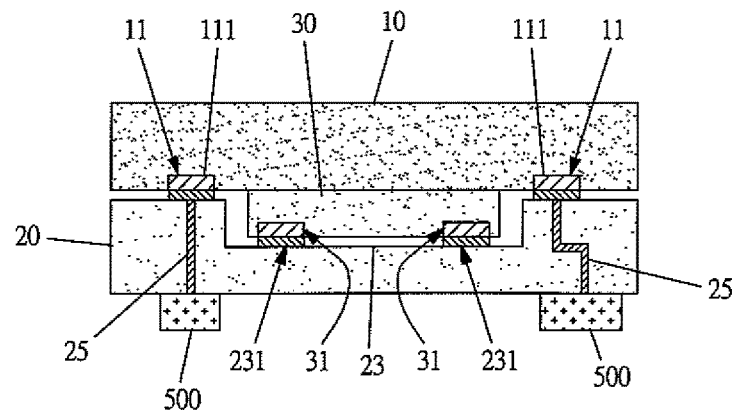
FIG. 8 shows another schematic cross section view in the third application of the first embodiment of the present invention.

As shown in FIGS. 7 and 8, in the third applications of this embodiment, a lower surface of the first chip 10 is connected with a second ship 30. A lower side of the second chip 30 has at least one second ship joint 31.

The upper surface of the circuit board 20 has a first recess 23. A bottom side of the first recess 23 has recess joints 231 which are located corresponding to the second chip joints 31 of the second chip 30

In packaging, the second chip 30 is positioned at an inner side of the first recess 23. The recess joints 231 are combined to the second chip joints 31 of the second chip 30, as shown in FIG. 7, so that the second chip 30 is combined to the circuit board 20. See FIG. 8, the way for combining the recess joints 231 to the second chip joints 31 is performed by above mentioned ACF combination or convex pads combination. In FIG. 8, the way for combining the recess joints 231 to the second chip joints 31 are by ACF combination.

Figure 9:
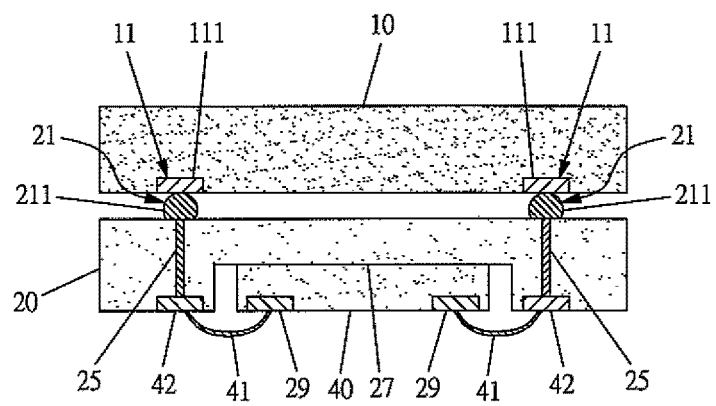
FIG. 9 is a schematic cross section view of the fourth application in the first embodiment of the present invention.
Figure 10:
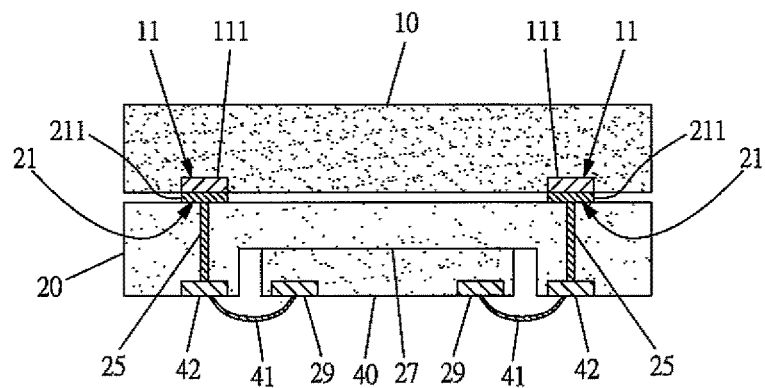
FIG. 10 is another schematic cross section view in the fourth application of the first embodiment of the present invention.

The fourth application of the present invention is illustrated in FIGS. 9 and 10, the structure in this application includes above said first chip 10.

A lower side of the circuit board 20 has a second recess 27. A bottom of the second recess 27 is installed with a third chip 40.

The combination of the first chip 10 and the circuit board 20 are identical to those disclosed in the first application, that is, ACF combination and convex pad combination, as illustrated in FIGS. 9 and 10. Therefore, the details will not be further disclosed herein. FIGS. 9 and 10 shows that the combination of the third chip 40 with the circuit board 20 are performed by ACF.

With reference to FIGS. 9 and 10, a lower side of the third chip 40 and a lower side of the circuit board 20 are combined through the joints 29, 42 and conductive wires 41.

Figure 11:
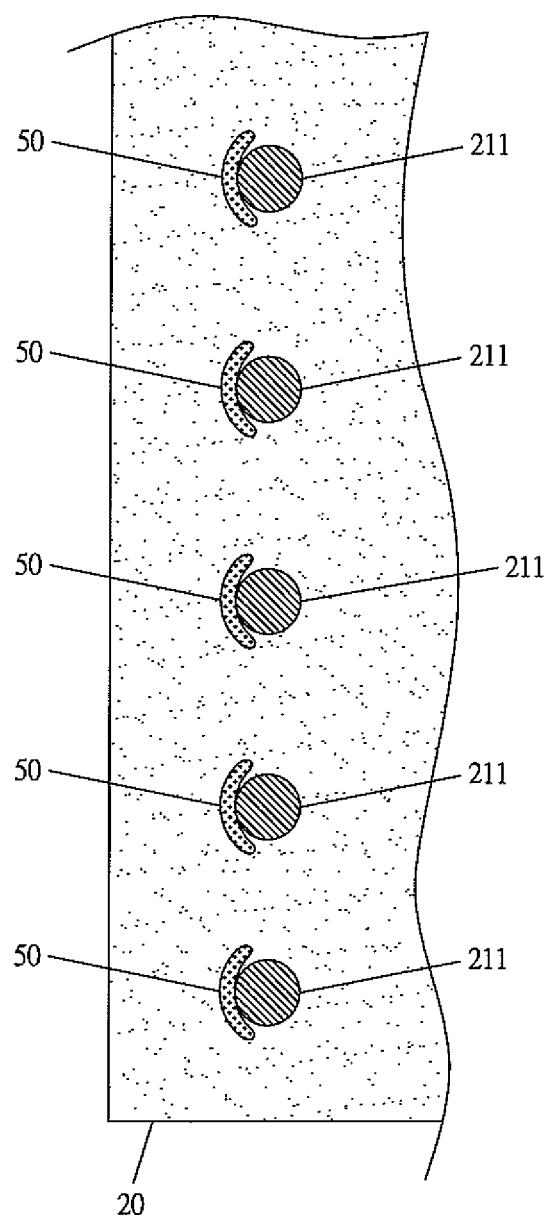
FIG. 11 is a plane partial schematic view of the third recess on the circuit board of the present invention.

In working, the expansion coefficient of the circuit board 20 is greater than those of the first chip 10 and the second chip 30, see FIG. 8. However, in the manufacturing process, high temperature heating, is necessary. This process will induce that the circuit board 20 is separated from the first chip 10 and the second chip 30 so that the combinations of the circuit board 20 with the first chip 10 and second chip 30 are not effective. To resolve this problem, as illustrated in FIG. 11, a periphery of the circuit board joints 21 (including ACF 211 or flat pad 212) is formed with a third recess 50 (cambered recess or U shape recess) which is near an edge of the circuit board 20. Therefore, when heating and expansion, the joint is provided with a margin for expansion to avoid that the circuit board 20 is separated from the first chip 10 or the second chip 30.

The second embodiment of the present invention will be described herein. In this embodiment, those elements identical to those in the first embodiment are illustrated by the same numerals and they have the same functions and effects. Therefore, the details will not be further described herein. Only the difference therebetween are described herein.

A firs wafer 10' includes a plurality of first chips 10 (in the drawing, two chips are used for description of the present invention). A lower side of each of the first chips 10 has at least one first chip joint 11.

A circuit board set 20' is located at a lower side of the first wafer 10'. The circuit board set 20' includes the plurality of circuit board joints 21 the number of which is corresponding to that of the first chip joints 11 of the first wafer 10'.

Figure 13:
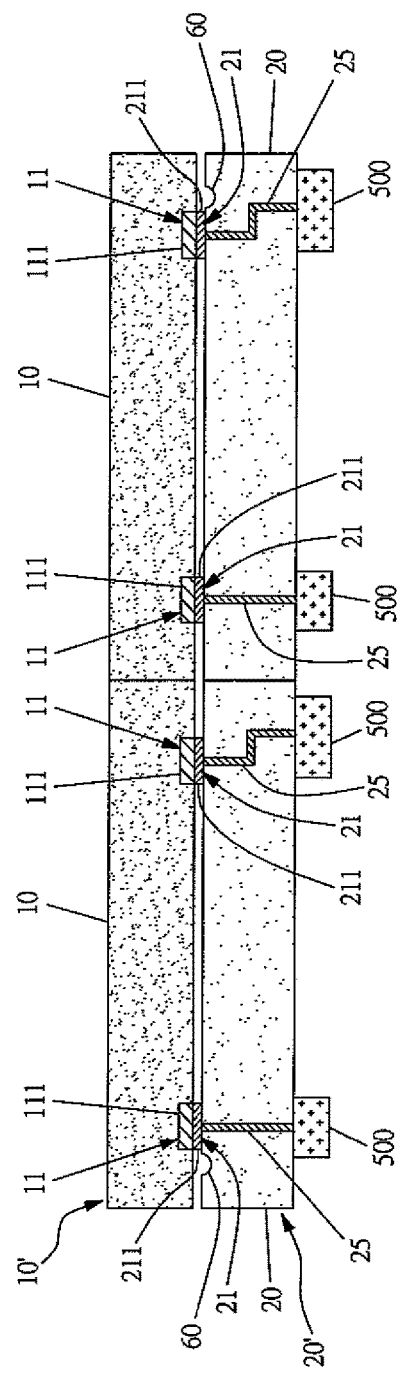
FIG. 13 is another schematic cross section view of the first application of the second embodiment of the present invention.

In packaging, the first chip joints 11 are combined to the circuit board joints 21 of the circuit board set 20' as illustrated in FIG. 13. Therefore, the first wafer 10' is combined to the circuit board set 20'. The combination of the first chip joints 11 to the circuit board joints 21 is by ACF combination or convex pad combination.

The first application of this embodiment is ACF combination, where the ACF is used to combine with pads so that the chip may be combined to the circuit board set.

Figure 12:
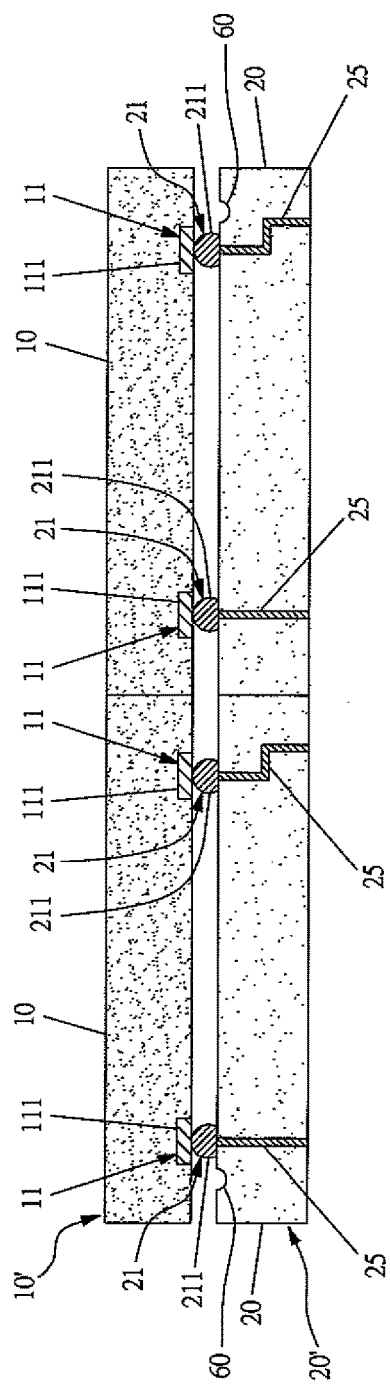
FIG. 12 is a schematic cross section view of the first application of the second embodiment of the present invention.

With reference to FIG. 12, in the ACF combination, the first chip joints 11 is a flat pad 111, and the circuit board joints 21 is an ACF 211. In packaging the ACFs 211 are compressed and thus deform to be adhered to the first chip joints 11 of the first chip 10, as shown in FIG. 13. Therefore, the first chip 10 is adhered to the circuit board set 20'.

Other circuit elements 500 may be installed at a lower side of the circuit board set 20' and are connected to the ACFs 211 through the conductive wires 25 passing through the circuit board set 20'.

The second application of this embodiment is the combination of convex pads, wherein convex pads and flat pads having the same material are installed to the circuit board set and the chip. The convex pads and flat pads are combined by chemically way or physically way so that the circuit board set is combined to the chip.

Figure 14:
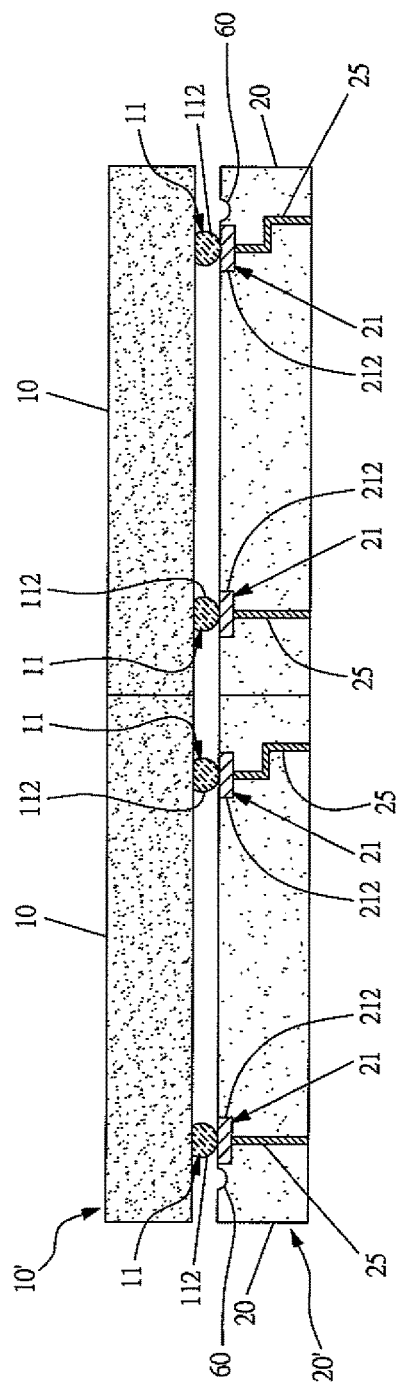
FIG. 14 is a schematic cross section view in the second application of the second embodiment of the present invention.
Figure 15:
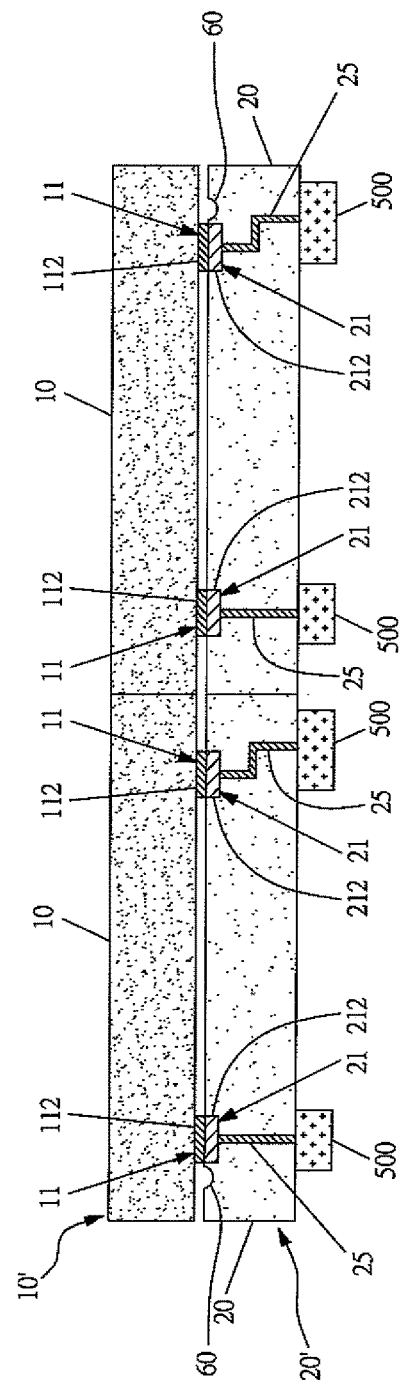
FIG. 15 is another schematic cross section view of the second application of the second embodiment of the present invention.

In the convex pad combination, the first chip joints 11 are convex pads 112 (such as metal joints or tin balls) protruded from a lower surface of the first wafer 10'. The circuit board joints 21 are flat pads 212. Material of the flat pads 212 is identical to that of the convex pads 112. In packaging, the convex pads 112 of the first wafer 10' are combined to corresponding flat pads 212 as illustrated in FIG. 14 so that the first chip 10 is combined to the circuit board set 20', as illustrated in FIG. 15. When the material of the convex pads 112 is metal, supersonic combination may be used. When the convex pads 112 are tin balls, welding combination is used.

Figure 16:
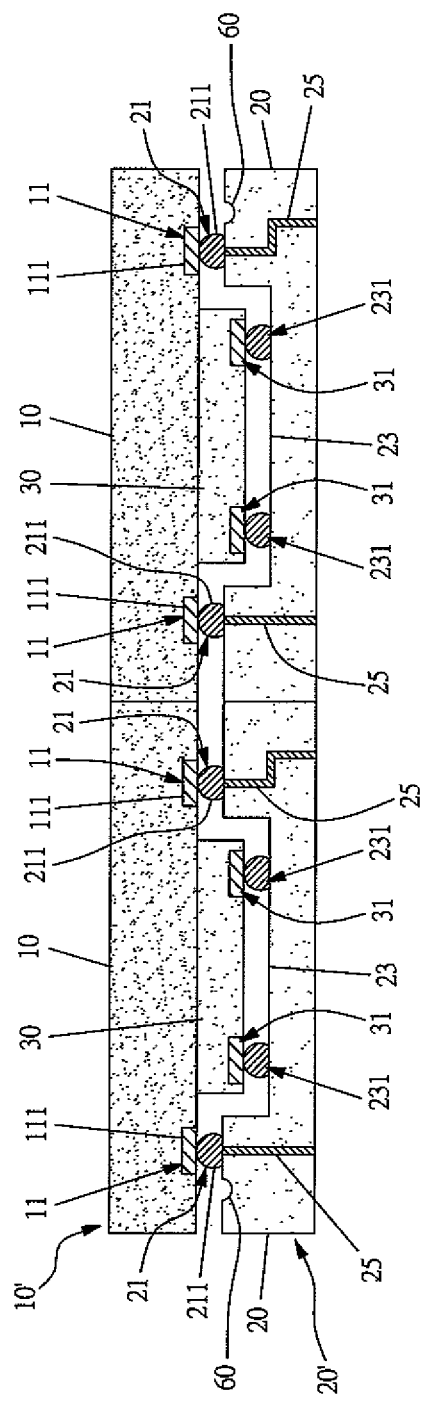
FIG. 16 is a schematic cross section view about the third application of the second embodiment of the present invention.
Figure 17:
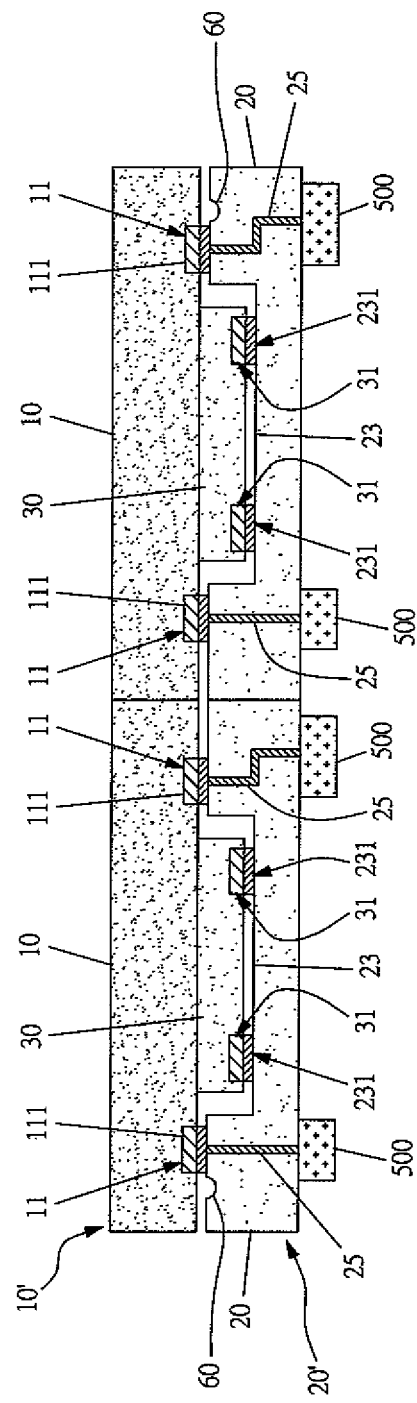
FIG. 17 is another schematic cross section view in the third application of the second embodiment of the present invention.

Referring to FIGS. 16 and 17, in the third application of this embodiment a lower side of the first chip 10 is connected to a second chip 30. The lower side of the second chip 30 has at least one second chip joints 31.

The upper surface of each circuit board 20 is formed with a first recess 23, respectively. A bottom of each first recess 23 has at least one recess joints 231 which are positioned corresponding to those of the second chip joints 31 of the second chip 30.

In packaging, the second chip 30 is positioned within the first recess 23 of the circuit board 20. The recess joints 231 are combined to the second chip joints 31 of the second chip 30, as illustrated in FIG. 16 so that the second chip 30 is combined to the circuit board 20, as illustrated in FIG. 17. The way for combining the recess joints 231 to the second chip joints 31 are by ACF combination or convex pad combination. FIGS. 16 and 17 show the ACF combination is used to combine the recess joints 231 to the second chip joints 31.

In above embodiment, in manufacturing, the circuit board set 20' has an expansion coefficient greater than those of the first chip 10 and the second chip 30, but the process needs to be performed in high temperature, as a result, the circuit board set 20' will separate from the first chip 10 and the second chip 30 so that the combination fails.

To resolve this problem, as illustrated in FIGS. 12 to 17, a periphery of some of the circuit board joints 21 (including ACF 211 or flat pad 212) are formed with fourth recesses 60 (cambered recesses or U shape recesses) which are near an edge of the circuit board set 20'. Therefore, when heating and expansion, the joint is provided with a margin for expansion to avoid that the circuit board 20 is separated from the first chip 10 or the second chip 30.

Figure 18:
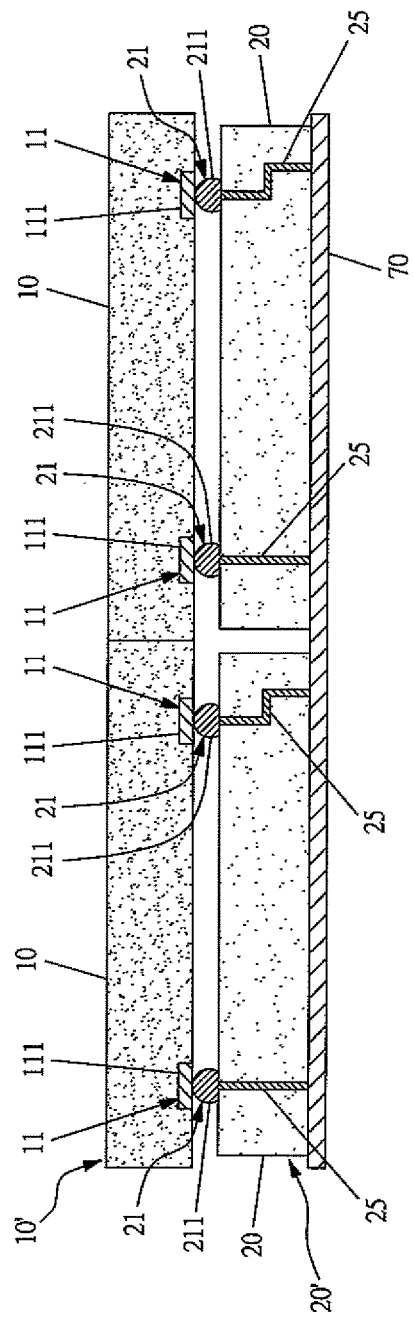
FIG. 18 is a schematic cross section view showing the state of the circuit board in the second embodiment of the present invention.

Another way for absorption of expansion is that the circuit board set 20' is cut firstly and then the lower side of the circuit board set 20' is adhered with an adhesive film 70 for packaging (referring to FIG. 18). The adhesive film 70 is elastic so that it can provide with expansion margin for absorption the expansion of the circuit board set 20' in heating.

Figure 19:
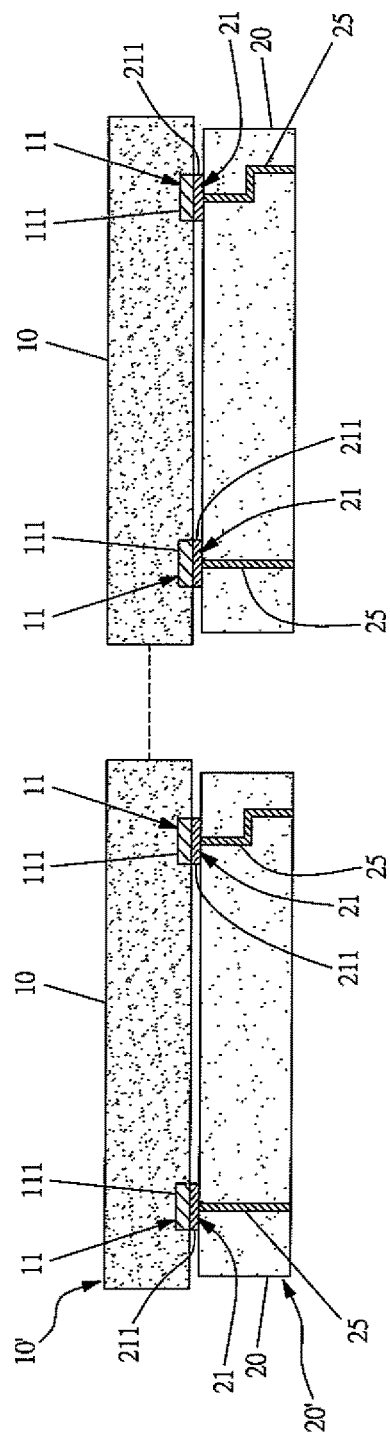
FIG. 19 is a schematic view showing the cutting of the chip and related circuit board in the second embodiment of the present invention.

With reference to FIG. 19, in this embodiment, after completing the combination of the first chip 10' with the circuit board set 20', the individual first chip 10 and circuit board 20 can be combined as a single unit.

Advantage of the present invention are that the joints and conductive wires are hidden within the circuit board and chips and are not exposed out so that the whole packaging structure can be reduced. Therefore, the costs in manufacturing and packaging are also reduced.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A chip package structure, comprising:
   a first chip (10) having a plurality of first chip joints (11) at a lower side thereof;
   a circuit board (20) below the first chip; an upper side of the circuit board (20) being arranged with a plurality of circuit board joints (21) at positions corresponding to those of the first chip joints of the first chip;
   in packaging, the first chip joints being combined with the circuit board joints of the circuit board so that the first chip is combined to the circuit board by a way of ACF (anisotropic conductive film) combination or convex joint combination; and
   wherein in the ACF combination, ACFs are used as welding points to be combined to pads at another end so that the first chip is combined to the circuit board; and
   wherein in the convex pad combination, a convex pad is combined with a flat pad by chemically methods or physical methods; and these pads are arranged on the circuit board and the first chip; and
   wherein the first chip joints (11) are convex pads (112') protruded from a bottom surface of the first chip (10), the bottom surface is turned upside down so that the convex pads (112') are at an upper side: the circuit board joints (21) are convex pads (212'); in packaging, the convex pads (112') of the first chip (10) are combined to the circuit board joints (21) through conductive wire (150'); when there are plurality of first chip joints (11) and circuit board joints (21), the conductive wires (150') are arranged on a conductor wire arranged substrate (152'), and then the conductor wire arranged substrate (152') runs across the circuit board joints (21) and the first chip joints (11).

2. The chip package structure as claimed in claim 1, wherein when material of the convex pad is metal, the combination is performed by supersonic combination and when material of the convex pad is tin, welding is used in combination.

3. The chip package structure as claimed in claim 1, wherein a periphery of the circuit board joints is formed with a third recess which is a cambered recess or a U shape recess and is near an edge of the circuit board; therefore, when heating and expansion, the joint is provided with a margin for expansion to avoid that the circuit board is separated from the first chip.

\* \* \* \* \*